(12) United States Patent
Ravikumar et al.

(10) Patent No.: US 10,768,225 B1
(45) Date of Patent: Sep. 8, 2020

(54) PROBE PLACEMENT FOR LASER PROBING SYSTEM

(71) Applicant: Advanced Micro Devices, Inc., Santa Clara, CA (US)

(72) Inventors: Venkat Krishnan Ravikumar, Singapore (SG); Wen Tsann Lua, Singapore (SG); Gopinath Ranganathan, Singapore (SG); Yi Xuan Seah, Singapore (SG); Shei Lay Phoa, Singapore (SG); Nathan Linarto, Singapore (SG); Jiann Min Chin, Singapore (SG)

(73) Assignee: Advanced Micro Devices, Inc., Santa Clara, CA (US)

( * ) Notice: Subject to any disclaimer, the term of this patent is extended or adjusted under 35 U.S.C. 154(b) by 6 days.

(21) Appl. No.: 16/296,614

(22) Filed: Mar. 8, 2019

(51) Int. Cl.
*G01R 31/311* (2006.01)

(52) U.S. Cl.
CPC ................. *G01R 31/311* (2013.01)

(58) Field of Classification Search
CPC ........ H01L 22/20; G01P 5/26; G01R 29/0885
See application file for complete search history.

(56) References Cited

U.S. PATENT DOCUMENTS

| | | | |
|---|---|---|---|
| 6,072,179 A | 6/2000 | Paniccia et al. | |
| 9,651,610 B2 | 5/2017 | Eiles et al. | |
| 10,012,692 B2 | 7/2018 | Ross et al. | |
| 2011/0138506 A1* | 6/2011 | Humphris | G01B 11/0608 850/6 |
| 2015/0013035 A1* | 1/2015 | Humphris | G01Q 10/045 850/1 |
| 2015/0365653 A1* | 12/2015 | Tohme | G01S 7/4813 348/46 |

OTHER PUBLICATIONS

Venkat Krishnan Ravikumar, Winson Lua, Seah Yi Xuan, Gopinath Ranganathan and Angeline Phoa; "Combinational Logic Analysis using Laser Voltage Probing"; White paper; ISTFA 2015; 41st International Symposium for Testing and Failure Analysis; Nov. 1-5, 2015; Portland, OR; United States; 7 pages.

(Continued)

*Primary Examiner* — Alvaro E Fortich
(74) *Attorney, Agent, or Firm* — Polansky & Associates, P.L.L.C.; Paul J. Polansky (57) ABSTRACT

A control system for placing an optic probe includes a receiver circuit that receives reflected light produced from the optic probe and provides a laser probe (LP) waveform of the reflected light in response to an activation of a trigger signal. A combinational logic analysis (CLA) processor provides a CLA waveform in response to simulating an optical response at a target location on a surface of a cell of a device under test to a test pattern. A test controller receives the CLA waveform and the LP waveform, and has a first output for providing the trigger signal, a second output for providing the test pattern, and a third output for providing a position signal. The test controller updates the position signal to move the optic probe closer to the target location according to a degree of fit between the LP waveform and the CLA waveform.

20 Claims, 11 Drawing Sheets

(56) References Cited

OTHER PUBLICATIONS

Eli Abuayob, Evgny Nisenboim, Amir Revah, Baohua Niu and Tom Tong; "Complex Waveform Analysis for Advanced CMOS ICs: Physics of Complex Waveform Signals for Design Validation and Debug Application"; ISTFA 2016; 42nd International Symposium for Testing and Failure Analysis; Nov. 6-10, 2016; Fort Worth, TX; United States; 8 pages.

V.K. Ravikumar, G. Lim, J.M. Chin, K.L. Pey, J.K.W. Yang; "Understanding spatial resolution of laser voltage imaging"; Microelectronics Reliability, 88-90; Elsevier Publication; 2018; pp. 255-261; 7 pages.

Venkat Krishnan Ravikumar, et al.; "Pattern search automation for combinational logic analysis"; Conference Proceedings from the 44th International Symposium for Testing and Failure Analysis; ISTFA 2018; Oct. 28-Nov. 1, 2018; Phoenix, AZ; United States; pp. 86-92; 7 pages.

* cited by examiner

PROBE PLACEMENT FOR LASER PROBING SYSTEM

BACKGROUND

Integrated circuits experience circuit failures from a variety of causes. For example, problems in the manufacturing process can result in defects that prevent the circuit from operating properly. Integrated circuits are tested at the manufacturing facility for proper operation before being shipped to customers. However, the integrated circuits can have defects that are not found during manufacturing test due to the inability to test every circuit node in the integrated circuit. Also the integrated circuit can operate properly at the factory but subsequently fail when placed in a larger product that is sold to an end user. The subsequent failures can be caused by circuit degradation over time, mechanical stresses leading to cracks and voids, and chemical contamination from mobile ions. When a failure occurs, whether due to the manufacturing process, design, reliability, or incorrect usage of the integrated circuit, there is a need to isolate the failure and determine the source of the failure in order to take corrective action.

Integrated circuit engineers typically determine the operation in which the failure occurs and then identify the circuit element that caused the failure. A test program can typically be used to identify the operation. However isolating the actual failing circuit is much more difficult. Historically, engineers removed passivation covering the chip and placed tiny needles, and subsequently electron beams, on exposed metal to capture signals and compare the captured signals to expected results. However, with the advent of flip-chip technology and as integrated circuit manufacturing technology progressed, circuit features became too small for mechanical probes, leading engineers to adopt laser probing.

With laser probing, also known as optic probing or electro-optic probing, a laser source is focused at a single node of an integrated circuit, and the characteristics of the reflected laser light indicate changes in the voltage of the node over time. Typical laser probing uses visible light or infrared radiation, and the chip is probed from the backside, i.e. the non-active surface. This technique has allowed probing resolution down to about 200 nanometers (nm). However as minimum transistor geometries have shrunk to much smaller sizes such as 16 nm and 14 nm, it has become difficult to discern the operation of a single transistor using laser probing, especially in the vicinity of other active transistors.

One known technique to solve these problems is to probe the integrated circuit die from the backside using shorter wavelength light, such as light in the visible spectrum despite silicon being highly absorptive in the visible spectrum. Though it achieves better resolution, this technique creates other problems. First, it requires the integrated circuit die to be thinned down to below 5 microns (μm) to overcome the losses in signal via absorption in the substrate, making it difficult to analyze failures. This process adds risk of damage caused by thinning the die, and affects the thermal dissipation in the active circuits. Second, because of the reduced wavelength, the light itself can change the behavior of the circuit. Thus this technique has proved to be inadequate.

In the following description, the use of the same reference numbers in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Also various components are referred to as "optics" or "optical", but it is to be understood that these names do not imply that the electromagnetic signals are necessarily within the visible range.

DETAILED DESCRIPTION OF ILLUSTRATIVE EMBODIMENTS

A control system for placement of an optic probe by a laser probing system includes a receiver circuit, a combinational logic analysis (CLA) processor, and a test controller. The receiver circuit has an input for receiving reflected light produced from the optic probe, a control input for receiving a trigger signal, and an output for providing a laser probe (LP) waveform of the reflected light in response to an activation of the trigger signal. The CLA processor has an output for providing a CLA waveform in response to simulating an optical response at a target location on a surface of a cell of a device under test to a test pattern. The test controller has a first input for receiving the CLA waveform, a second input for receiving the LP waveform, a first output for providing the trigger signal, a second output for providing the test pattern, and a third output for providing a position signal, wherein the test controller updates the position signal to move the optic probe closer to the target location according to a degree of fit between the LP waveform and the CLA waveform.

A laser probing system laser probes a device under test having a cell. The laser probing system includes a laser source, an optical system, a receiver circuit, a combinational logic analysis (CLA) processor, and a test controller. The optical system provides an optic probe at selectable locations of the device under test in response to light from the laser source, receives reflected light from the device under test, and outputs the reflected light. The receiver circuit receives the reflected light from the optical system, and provides a laser probe (LP) waveform in response to the reflected light. The CLA processor simulates an optical response at a target location of the cell of the device under test to a test pattern and forms a CLA waveform in response. The test controller has a first input for receiving the CLA waveform, a second input for receiving the LP waveform, and an output for providing a position signal, wherein the test controller applies the test pattern to the device under test, triggers the receiver circuit to capture the LP waveform, and repositions the optic probe on the device under test closer to the target location according to a degree of fit between the LP waveform and the CLA waveform.

A method of performing an optic probe test includes computing a combinational logic analysis (CLA) waveform at a target probe location within a cell of a device under test using a test pattern. An optic probe is positioned at an initial location in response to an estimated location of the cell. The test pattern is applied to the cell and a first laser probe (LP) waveform is obtained in response. The optic probe is positioned at an adjacent location. The test pattern is applied to the cell, and a second LP waveform is obtained in response. The optic probe is repositioned at a location closer to the target probe location according to a degree of fit of a corresponding LP waveform and the CLA waveform. Defects are identified based on a comparison of an actual waveform to the CLA waveform at the location closer to the target probe location.

Figure 1:
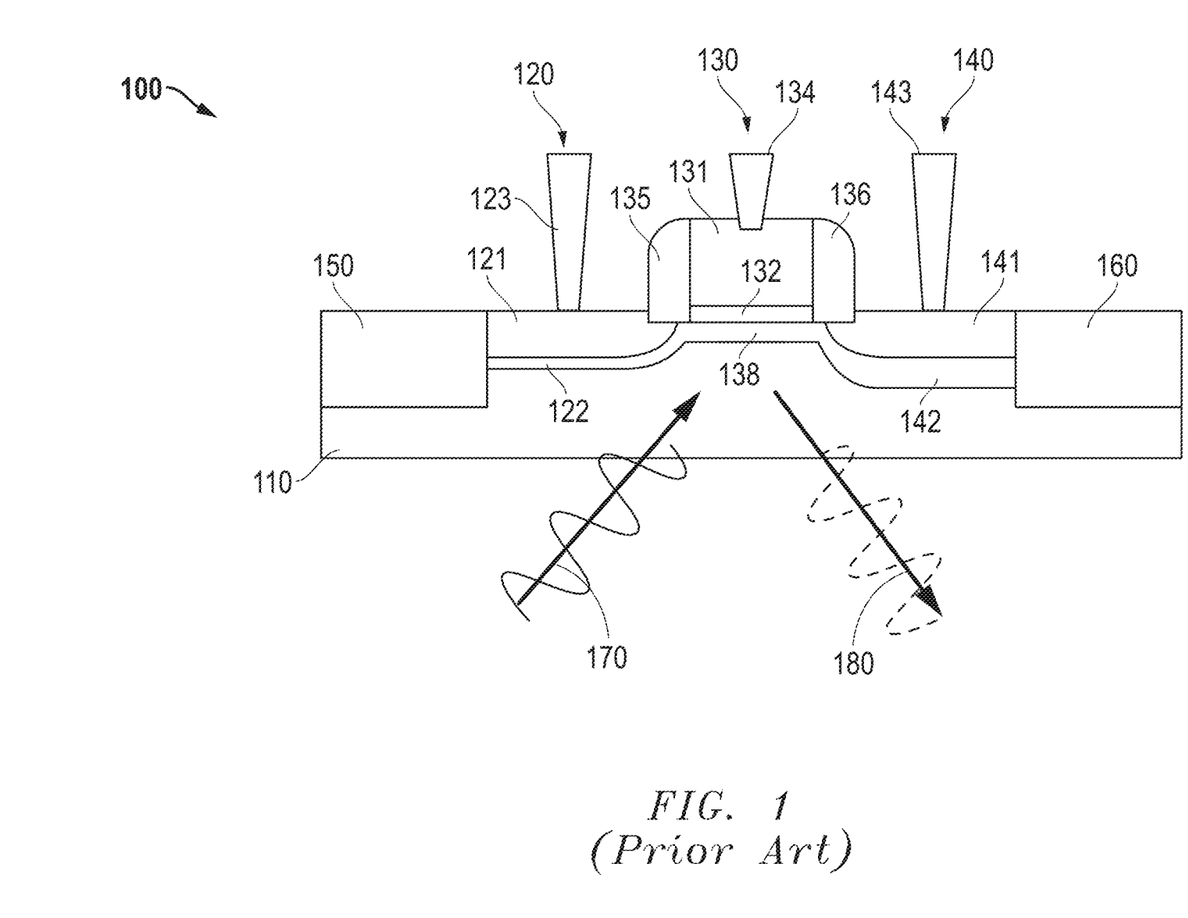
FIG. 1 illustrates a cross section of an integrated circuit being probed using a technique known in the prior art.

FIG. 1 illustrates a cross section of an integrated circuit 100 being probed using a technique known in the prior art. As shown in FIG. 1, integrated circuit 100 has a front side containing an active surface oriented on the top and a back side oriented on the bottom. Integrated circuit 100 is formed with a lightly-doped p-type ("p−") substrate 110. The cross section in FIG. 1 shows a portion of integrated circuit 100 having a metal-oxide-semiconductor (MOS) transistor formed with a source portion 120, a gate portion 130, and a drain portion 140. Source portion 120 has a heavily-doped n-type ("n+") diffusion 121 forming the source of the transistor, a free carrier region 122 underlying n+ source region 121, and a metal via 123 that extends upward to a conductor forming a more negative power supply voltage terminal labeled "$V_{SS}$" (not shown in FIG. 2). Gate portion 130 includes a gate 131, a gate dielectric 132, a free carrier region 133, a via 134 that extends upward to a signal conductor (not shown in FIG. 2) that conducts a voltage labeled "$+V_G$", and sidewall portions 135 and 136. Drain portion 140 has an n+ drain diffusion 141 forming the drain of the transistor, a free carrier region 142 underlying n+ drain diffusion 141, and a via 143 to a signal conductor (not shown in FIG. 1) conducting a signal labeled "$+V_D$". Integrated circuit 100 also includes oxide regions 150 and 160 at left and right ends of the transistor. Oxide regions 150 and 160 are high resistance dielectric regions that isolate the source and drain regions of the transistor from surrounding circuitry. FIG. 1 shows oxide regions 150 and 150 as regions formed in substrate 110 such as would be formed by shallow trench isolation (STI), but it should be apparent that the transistor has been formed by just one possible device structure, the n-channel MOS transistor, and other device structures such as a P-channel MOS transistor, a silicon-on-insulator (SOI) transistor, a FINFET, and the like can be analyzed using laser probing as well.

When it is desired to probe the transistor, a laser probing system (not shown in FIG. 1) provides an incident beam of light 170 through the back side of integrated circuit 100 to free carrier region 133 below gate portion 130. As the transistor becomes conductive and non-conductive, the size of free carrier region 133 increases and decreases, amplitude modulating the reflected beam 180. The laser probing system includes a receiver circuit that measures the amplitude of the reflected laser light to determine whether the transistor is conductive at a desired point in time. Moreover the measurement can occur repeatedly to form a histogram by which the laser probing system can reconstruct the electrical signal over a time period of interest.

Figure 2:
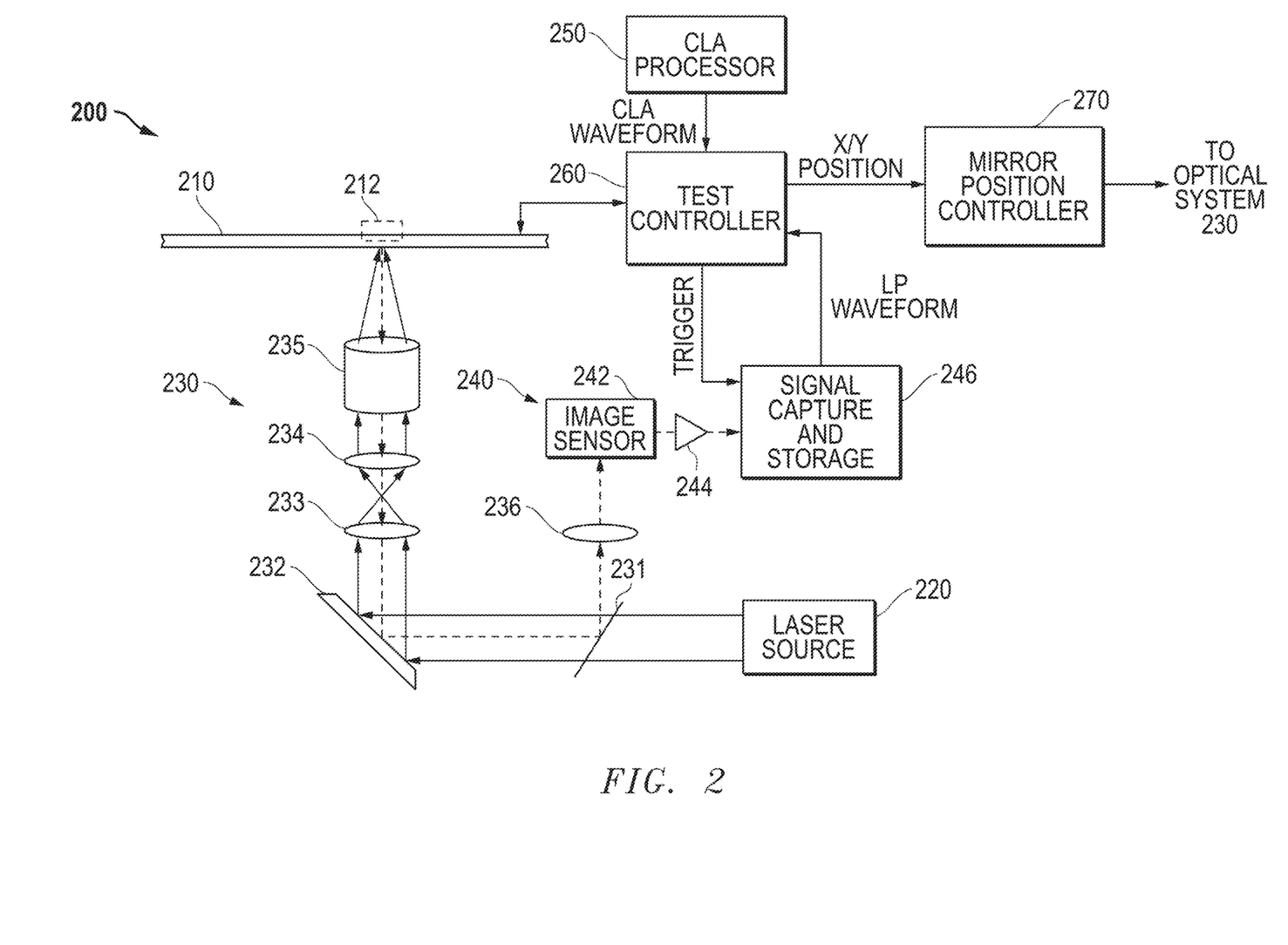
FIG. 2 illustrates in block diagram form a laser probing system according to some embodiments.

FIG. 2 illustrates in block diagram form a laser probing system 200 according to some embodiments. Laser probing system 200 includes generally a device under test 210, a laser source 220, an optical system 230, a receiver circuit 240, a combinational logic analysis (CLA) processor 250, a test controller 260, and a mirror position controller 270.

Device under test 210 is an integrated circuit that, as shown in FIG. 2, has a front side oriented upward and a back side oriented downward. Device under test 210 also has a cell 212 to be laser probed using a test program applied to input terminals.

Laser source 220 emits an incident beam of coherent laser light at a predetermined frequency. In some embodiments, the incident beam could have a wavelength ($\lambda$) in the infrared region. In particular, the incident beam could have a wavelength in the near-infrared region such as $\lambda=1064$ nm, $\lambda=1122$ nm, $\lambda=1154$ nm, or $\lambda=1319$ nm. In one particular embodiment, the incident beam has a wavelength with a wavelength much closer to the visible range, with $\lambda=785$ nm.

Optical system 230 includes a beam splitter 231, an X/Y scan mirror 232, a scan lens 233, a tube lens 234, an objective lens 235, and a focus lens 236. Beam splitter 231 has a left surface and a right surface as oriented in FIG. 2. The left surface receives light emitted by laser source 220 and passes the light through beam splitter 231 substantially uninterrupted. The right surface receives light and reflects it upward. X/Y scan mirror 232 reflects light and is controllable to move the position of the emitted and returned light to and from the back side of device under test 210. Scan lens 233, tube lens 234, and objective lens 235 further condition the incident laser light on the back side of device under test 210 that has been steered to the desired position by controlling X/Y scan mirror 232. The incident radiation interacts with circuitry in cell 212 and forms a reflected beam according to the electrical state of cell 212. The reflected light passes through objective lens 235, tube lens 234, and scan lens 233, and is directed by X/Y scan mirror 232 and beam splitter 231 through focus lens 236 to receiver circuit 240 for detection.

Receiver circuit 240 includes an image sensor 242, a buffer 244, and a signal capture and storage block 246. Image sensor receives the incident radiation from focus lens 236, and provides an electrical signal in response. Buffer 244 re-drives the electrical signal to prevent distortion of the output of image sensor 242. Signal capture and storage block 246 has a first input connected to the output of buffer 244, a second input for receiving a trigger signal labeled "TRIGGER", and an output for providing a signal labeled "LP WAVEFORM". In this way, receiver circuit 240 converts the reflected light from optical system 230 to electrical signal LP WAVEFORM.

CLA processor 250 has an output for providing a signal labeled "CLA WAVEFORM". CLA processor 250 forms the CLA WAVEFORM by simulating an optical response at a target location on a surface of cell 212 of device under test 210 to the application of the test pattern. As used herein, a "test pattern" generally means a set of electrical stimuli applied to a device under test. For example, the test pattern may be an indefinite loop of a set of test vectors within an automated test equipment (ATE) test pattern that causes the device under test to exhibit the desired behavior. The CLA WAVEFORM includes, for example, high and low voltages based on logic states but also interactions between the circuitry in cell 212 and adjacent circuitry, known generally as "cross-talk".

Test controller 260 has a first input for receiving the CLA WAVEFORM, a second input for receiving the LP WAVEFORM, a first output for providing the TRIGGER signal, a second output connected to device under test 210 for providing the test pattern and receiving output signals provided by device under test 210 in response to the test pattern, and a third output for providing a position signal labeled "X/Y POSITION".

Mirror position controller 270 has an input connected to the third output of test controller 260 for receiving the X/Y POSITION signal, and an output connected to optical system 230. For example, the output provided to optical system 230 could be voltages that change to position of X/Y scan mirror 232 to adjust the focused incident beam to another location relative to cell 212, or to another location in device under test 210, indicated by the X/Y POSITION, In operation, optical system 230 receives the incident radiation emitted by laser source 220, focuses it on a back side of device under test 210, and receives reflected radiation that is altered by the interaction of the incident radiation and active nodes in cell 212. Image sensor 242 is a photosensor array that receives the reflected light and provides an electrical signal in response. In general, the electrical signal is proportional to the amount of reflected radiation received at pixels in image sensor 242. Signal capture and storage block 246 forms a histogram of waveform intensities over a period of time initiated by the TRIGGER signal. Test controller 260 provide the TRIGGER signal at a selected point in the execution of the test pattern. For example, if device under test 210 is a data processor, then test controller 260 runs a test pattern to determine that the failure occurs during the execution of a certain instruction executed. Test controller 260 can then repeatedly provide the test pattern and trigger a capture of the optical response as mirror position controller sweeps the focal point over an area of cell 212.

While test controller 260 provides the test pattern and compares the test pattern to an expected response, CLA processor 250 simulates the optical pattern expected from a properly operating device under test in response to the application of the incident laser light to the back side of it.

One of the problems with the extremely small geometries is that it becomes very difficult to focus the laser beam precisely on a circuit of interest. Test controller 260 estimates a location of cell 212 of device under test 210 that is related to the test program failure. It next selects a set of probe points adjacent to the estimated location at which to capture the reflected light at the trigger point. It then runs the test pattern and triggers the capture of the LP WAVEFORM for each of the set of probe points. It determines a degree of fit between the CLA WAVEFORM and the LP WAVEFORM. It selects the location with the highest degree of fit as a location closest to the target location. It then runs the test pattern and captures histogram data to be used to identify the failure.

The operation of laser probing system 200 according to the technique described above will be further developed by reference to specific examples.

Figure 3:
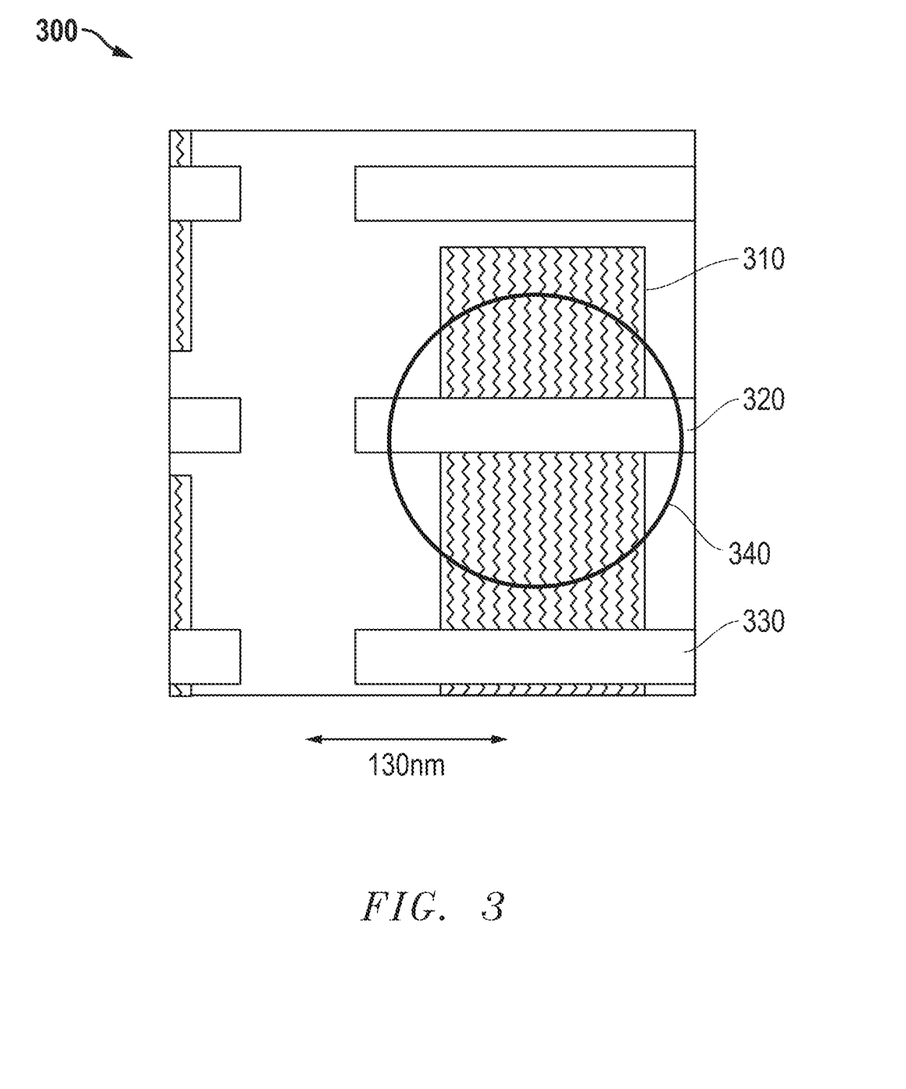
FIG. 3 illustrates a backside view of a standard cell area of an integrated circuit manufactured with 28 nm technology according to some embodiments.

FIG. 3 illustrates a backside view of a standard cell area 300 of an integrated circuit manufactured with 28 nm technology according to some embodiments. Standard cell area 300 includes an active region 310, a gate conductor 320, a gate conductor 330, and a laser probe area 340. Active region 310 can be, for example, an n-type diffusion in a p-type substrate. Each of gate conductor 320 and gate conductor 330 form gates of transistors and the transistors have source/drain regions surrounding a gate region that is overlaid by gate conductor 320 or gate conductor 330. Laser probe area 340 has a diameter of approximately 200 nm. In various other embodiments, the diameter can be between 150 nm and 250 nm.

One measure of the size of a transistor is known as a contacted poly pitch (CPP). The CPP of a transistor with a 14 nm gate width is about 78 nm. Standard cell area 300 shows that in 28 nm technology a 200 nm laser probe, if accurately positioned at a target in the middle of the gate, can adequately measure the activity of a single transistor, namely the transistor formed by gate conductor 320, without receiving significant interfering signals.

Figure 4:
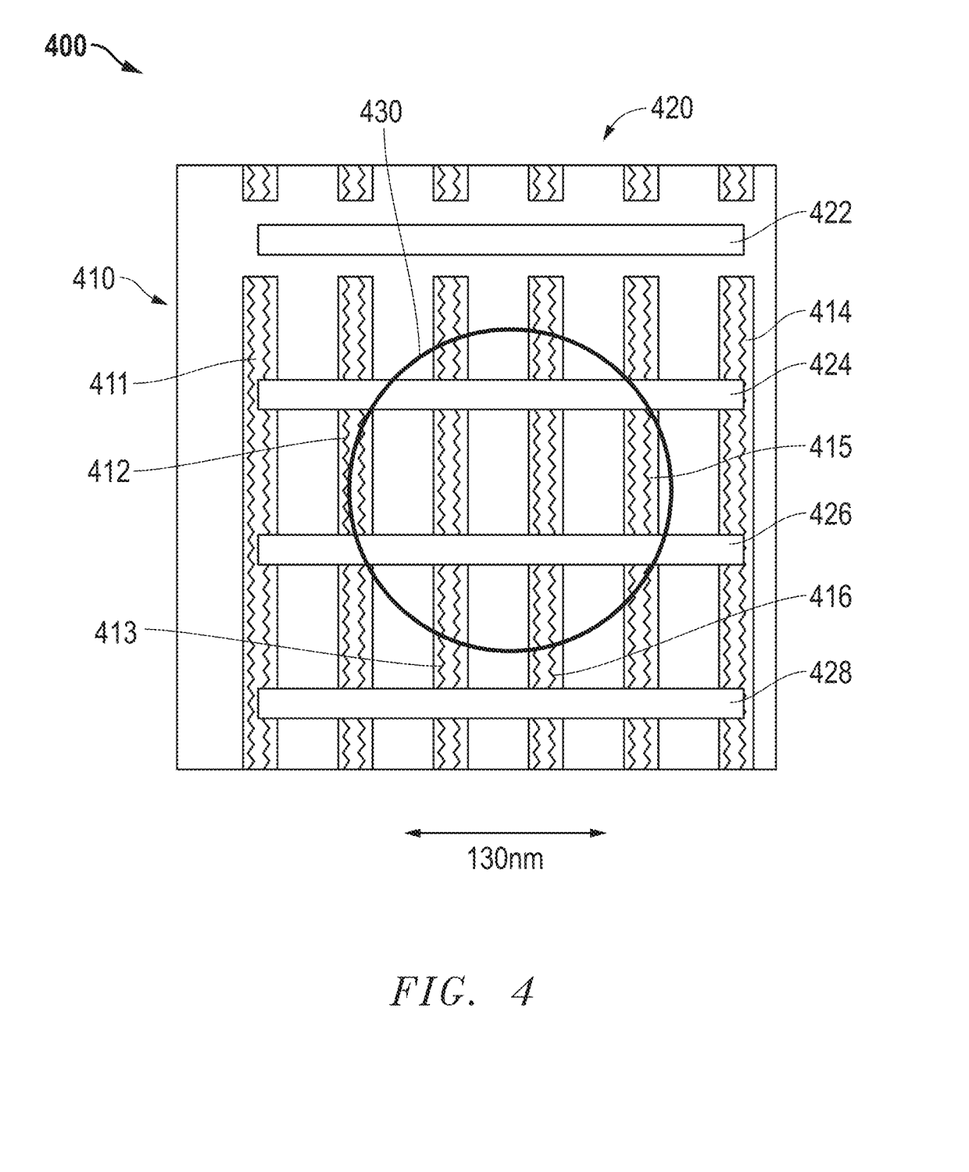
FIG. 4 illustrates a backside view of a standard cell area of an integrated circuit manufactured with 14 nm technology according to some embodiments.

FIG. 4 illustrates a backside view of a standard cell area 400 of an integrated circuit manufactured with 14 nm technology according to some embodiments. Standard cell area 400 includes active regions 410, gate conductors 420, and a laser probe area 430. Each active region in active regions 410 extends vertically as standard cell area 400 is oriented in FIG. 4, and includes representative active regions 411-416. Each gate conductor in gate conductors 420 extends horizontally as standard cell area 400 is oriented in FIG. 4, and include gate conductors 421-424. Laser probe area 430 again has a diameter of approximately 200 nm. Standard cell area 400 shows that in 14 nm technology, the laser probe, even if properly positioned, measures the activity of surrounding multiple transistors, and in this example captures the activity of 6-9 transistors.

Moreover if the integrated circuit were manufactured with even smaller 7 nm technology, the CPP would drop to about 55 nm. Thus as transistor size decreases, accurate laser probe placement becomes even more important.

Figure 5:
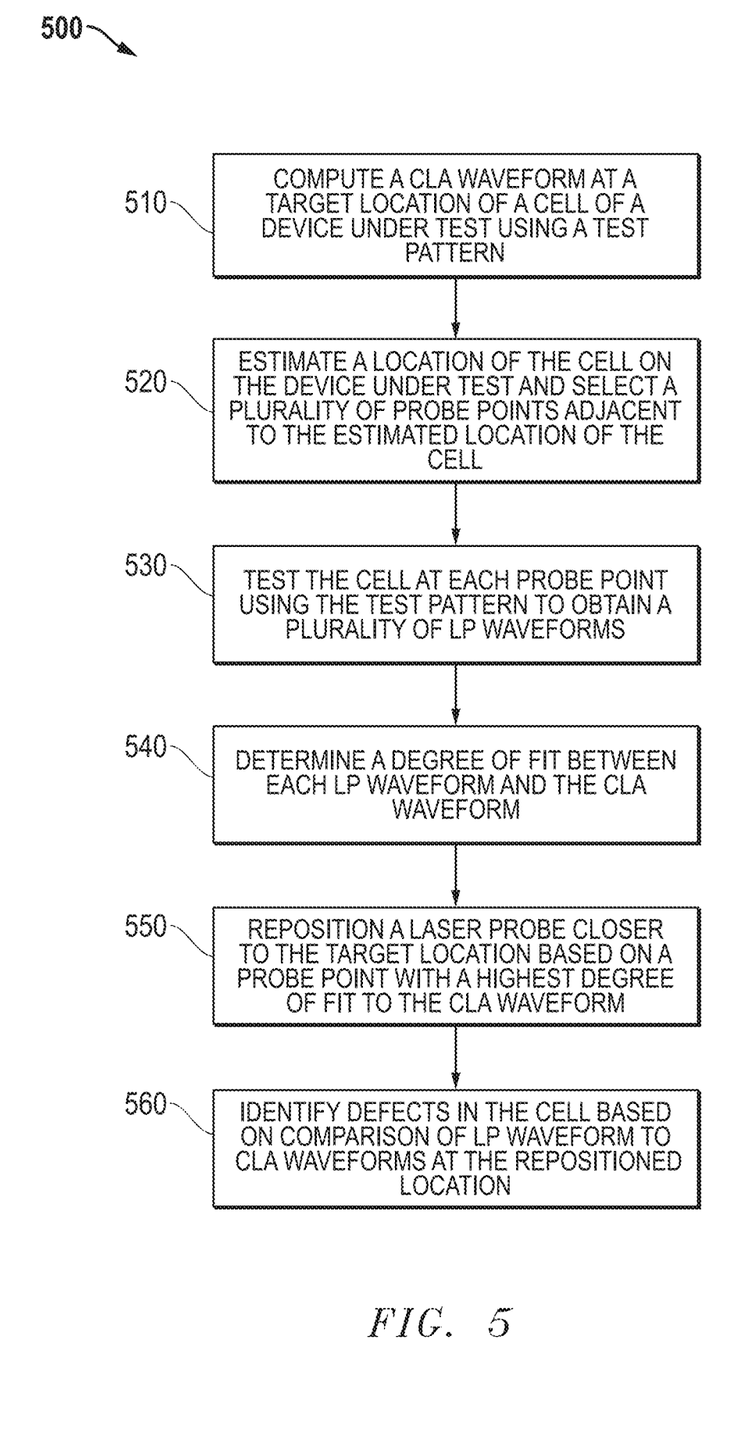
FIG. 5 illustrates a flow diagram of a laser probe placement algorithm for use with the laser probing system of FIG. 2 according to some embodiments.

FIG. 5 illustrates a flow diagram 500 of a laser probe placement algorithm for use with the laser probing system of FIG. 2 according to some embodiments. Flow diagram 500 starts with an action box 510, which computes a CLA waveform of a target location of a cell such as cell 212 of device under test 210 using a test pattern. An action box 520 estimates a location of the cell on device under test 210 and selects a plurality of probe points adjacent to the estimated location of the cell. An action box 530 tests the cell at each probe point using the test pattern to obtain a plurality of LP WAVEFORMs. An action box 540 determines a degree of fit between each LP WAVEFORM and the CLA WAVEFORM. An action box 550 repositions the laser probe closer to the target location based on a probe point with a highest degree of fit to the CLA WAVEFORM. An action box 560 identifies defects in the cell based on a comparison of the LP WAVEFORM to the CLA WAVEFORM at the repositioned location.

In an actual system, this incremental approach could be repeated for every probe point in the array to identify the probe point with the highest degree of fit between the CLA WAVEFORM and the corresponding LP WAVEFORM. Note, however, that if there were an actual defect at a probe point, then the comparison may not result in a high degree of fit due to the distortion caused by the defect. In this case, test controller 260 will attempt to reposition the probe to un upstream cell (circuitry that provides one or more inputs to the target cell), and verify its functionality, as well as reposition the laser probe to other locations of the cell to try to improve the match.

However, it is possible to reposition the optic probe using a sample test sequence that does not cause faulty operation, such as by running the test pattern at a relatively low frequency or with a relatively high power supply voltage. Once the laser probe is repositioned according to this technique, then the test pattern can be run under the conditions that are known to cause the failure.

Figure 6:
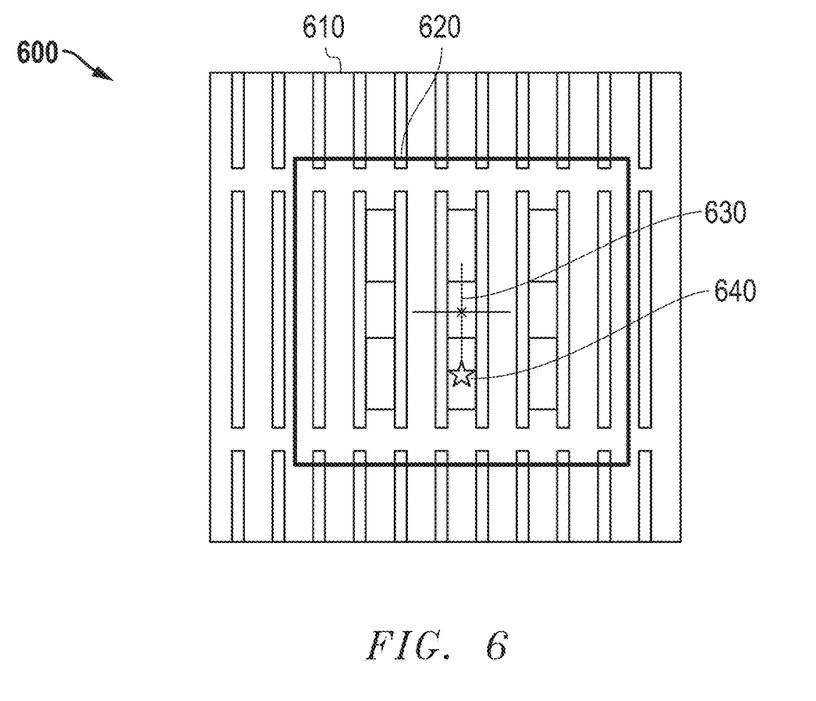
FIG. 6 illustrates a backside view of a standard cell area of an integrated circuit that will be laser probed according to some embodiments.

FIG. 6 illustrates a backside view of a portion 610 of an integrated circuit 600 including a cell 620 that will be laser probed according to some embodiments. Cell 620 includes several transistors and is believed to include at least defective transistor. A center of cell 620 is indicated to a crosshair mark 630. It is desired to probe cell 620 at a desired probe point 640 located below crosshair mark 630. In any laser probe system, it is difficult to accurately find the center of cell 620 by pre-calculation alone. According to the disclosed technique, the laser probing system first estimates the location of the center of cell 620 to bring the laser probe to a point estimated to be close to the node of interest.

Figure 7:
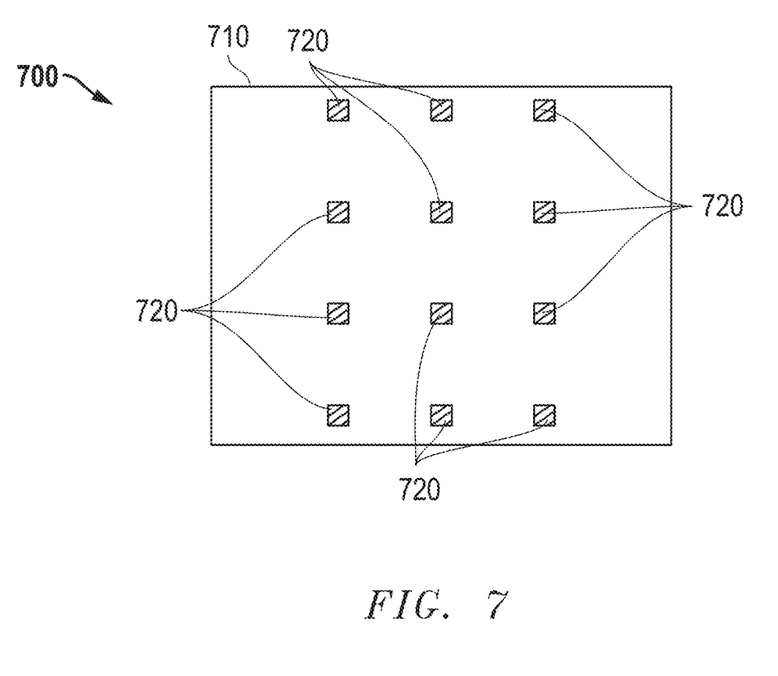
FIG. 7 illustrates a backside view of an exemplary laser pattern that may be used to determine a probe position relative to the standard cell area of FIG. 6.

FIG. 7 illustrates a backside view of an area 700 of an integrated circuit showing an exemplary laser probing pattern of cell 620 of FIG. 6. Area 700 is defined by selected points of a grid 710 that defines the incremental step size in both the horizontal ("X") and vertical ("Y") directions. Area 700 includes a set of twelve probe points 720 arranged in a four-row by three-column grid in which the points are equidistantly spaced in both the X- and Y-directions. It should be readily apparent the area 700 is just one example of a possible laser probing pattern and actual laser probing patterns will depend on the cell size, the sizes of the transistors, and the available laser probing step size.

Figure 8:
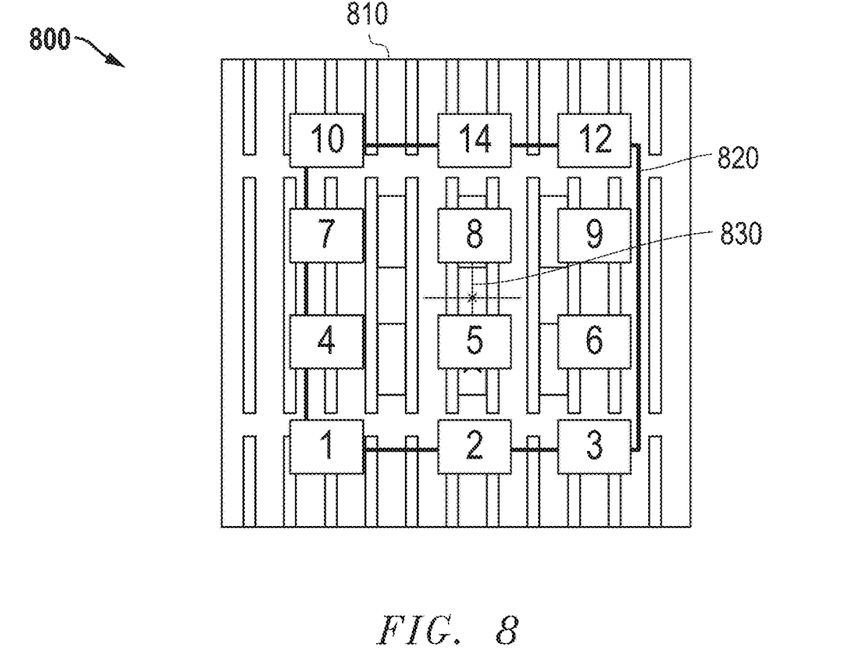
FIG. 8 illustrates a backside view of an exemplary laser sequence that may be used to obtain waveforms corresponding to the exemplary laser probing pattern of FIG. 7.

FIG. 8 illustrates a backside view of an area 810 of an integrated circuit 800 of FIG. 6 showing an exemplary laser probing sequence that may be used to obtain waveforms corresponding to the exemplary laser probing pattern of FIG. 7. The laser probing begins in a location at the bottom left, proceeding rightward for the three points in the first row labeled "1", "2", and "3". After completing the first row, the laser probing returns to the left and proceeds rightward for the three points in the second row labeled "4", "5", and "6". After completing the second row, the laser probing returns to the left and proceeds rightward for the three points in the third row labeled "7", "8", and "9". After completing the third row, the laser probing returns to the left and proceeds rightward for the three points in the fourth row labeled "10", "11", and "12". The laser probing system creates LP waveforms, i.e., incrementally-measured timing diagrams, that can be compared to the CLA WAVEFORM that represents the simulated results.

Figure 9:
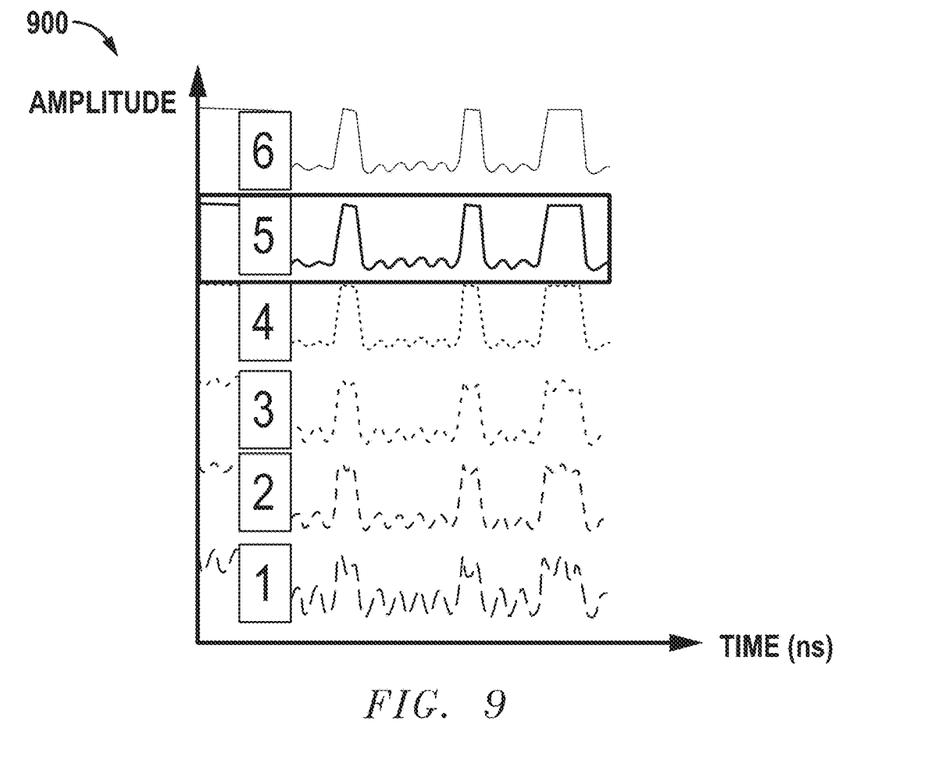
FIG. 9 illustrates a timing diagram of a first portion of the signals laser probed according to the exemplary laser probing sequence of FIG. 8.

FIG. 9 illustrates a timing diagram 900 of a first portion of the signals laser probed according to the exemplary laser probing sequence of FIG. 8. In timing diagram 900, the horizontal axis represents time in nanoseconds (ns), and the vertical axis the amplitude of several laser probe waveforms probed at corresponding locations, in arbitrary units, proportional to the voltage. So for example, the waveform labeled "1" represents probe location 1 in area 810, the waveform labeled "2" represents probe location 2 in area 810, and so on. As can be seen among these points, waveform 1 generally follows a pattern of changes in logic states, but shows substantially lower signal to noise ratio possibly due to cross-talk from adjacent circuitry, or insufficient laser overlap with the active nodes. Waveforms 4, 5, and 6, however, show far stronger signals and represent relatively clean transitions in logic state. Among the waveforms shown in FIG. 9, waveform 5 demonstrates the cleanest logic state transitions due to the best overlap between the laser and the active nodes.

Figure 10:
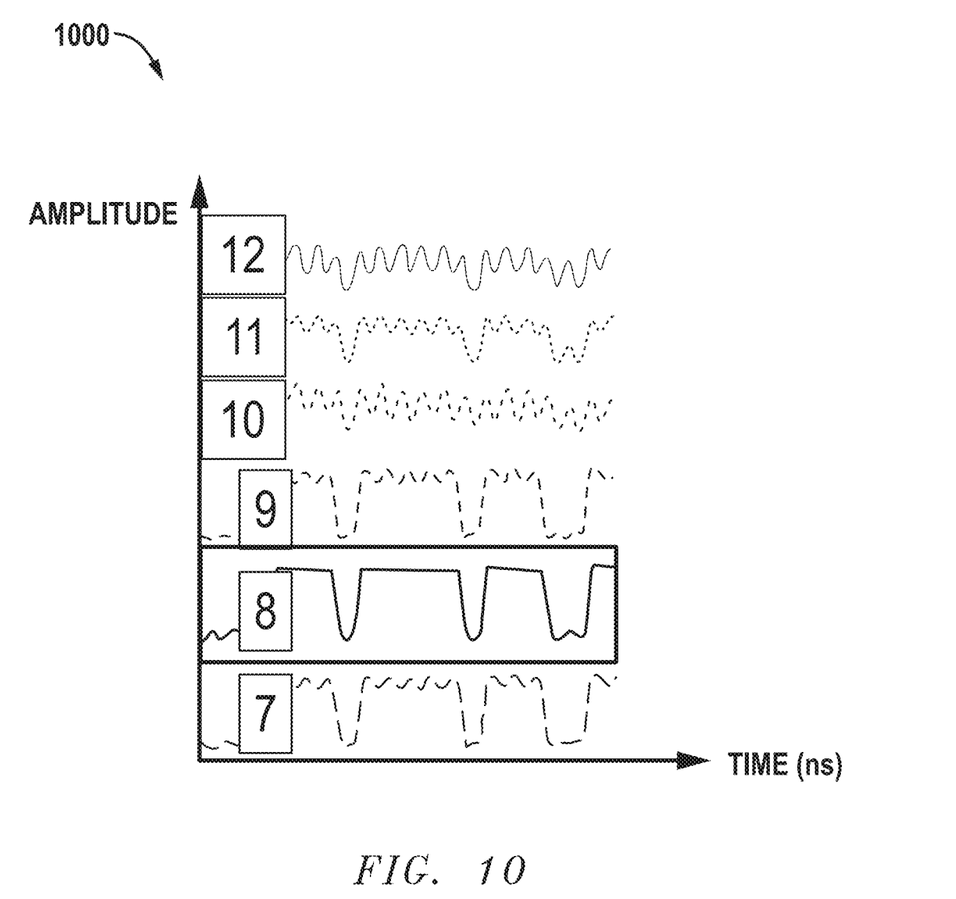
FIG. 10 illustrates a timing diagram of a second portion of the signals laser probed according to the exemplary laser probing sequence of FIG. 8.

FIG. 10 illustrates a timing diagram 1000 of a second portion of the signals laser probed according to the exemplary laser probing sequence of FIG. 8. In timing diagram 900, the horizontal axis represents time in ns, and the vertical axis the amplitude of several laser probe waveforms probed at corresponding locations, in arbitrary units proportional to the voltage. FIG. 10 includes waveforms 7-12. Waveforms 7, 8, and 9 along the third row show good logic state resolution with low cross-talk from adjacent cells, but have an inverted phase relationship to the signals in FIG. 8. Among the waveforms shown in FIG. 10, waveform 8 shows the least cross-talk and exhibits clean logic state transitions.

With these results, either probe location 5 or probe location 8 would be selected. These probe locations are the close to the center of the cell represented by crosshair marking 630, and measure nodes that reflect the operation of the cell with low cross-talk from adjacent nodes. Probe locations 5 and 8 both reflect the operation of the cell but with the phases inverted with respect to each other. However these comparisons show that test controller 260 can significantly improve the probing by updating the X/Y POSITION signal to move the optic probe closer to the target location, even a single step closer, according to a degree of fit between the LP WAVEFORM and the CLA WAVEFORM.

Figure 11:
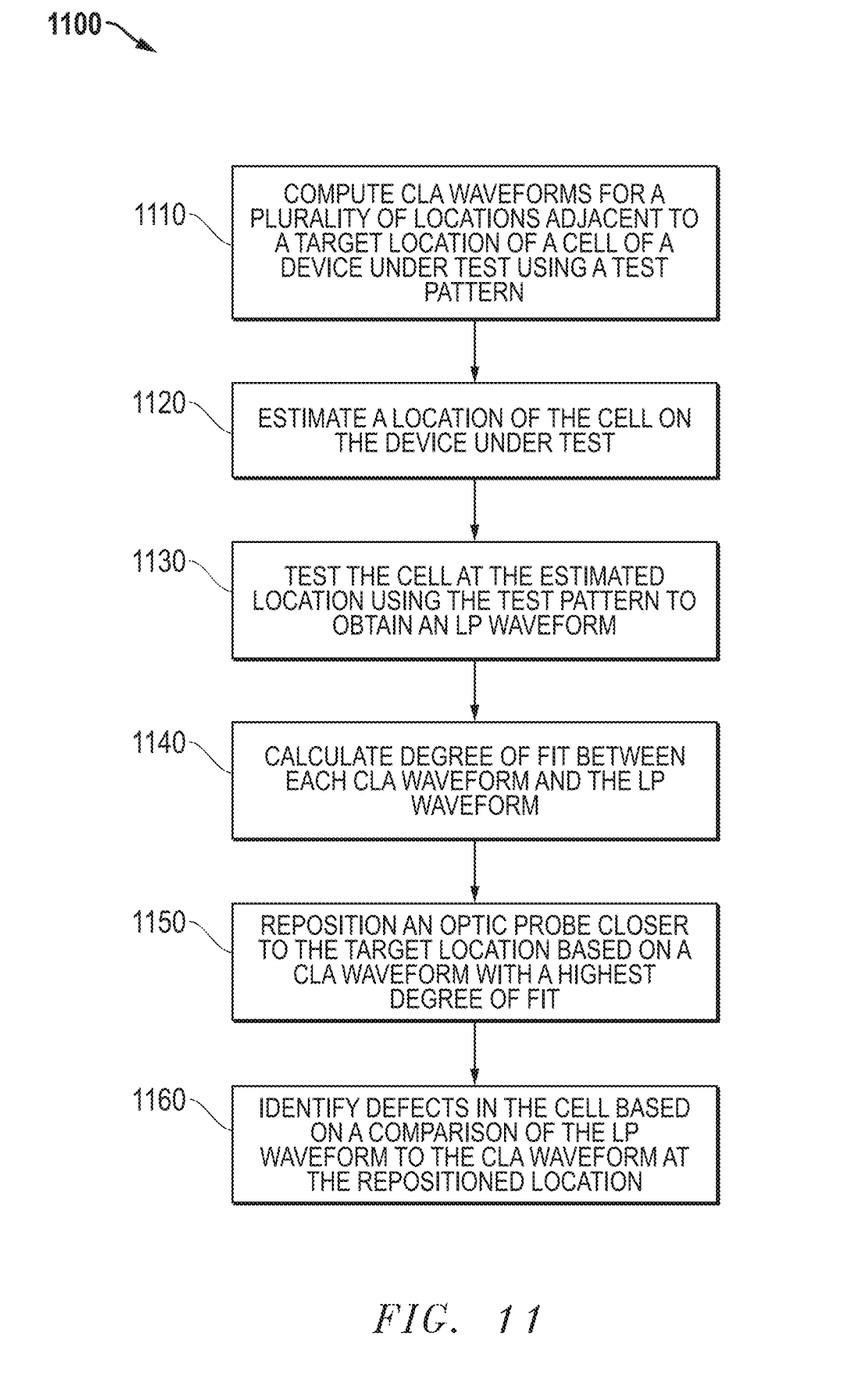
FIG. 11 illustrates a flow diagram of a laser probe placement and signal analysis algorithm for use with the laser probing system of FIG. 2 according to some embodiments.

FIG. 11 illustrates a flow diagram 1100 of a laser probe placement and signal analysis algorithm for use with laser probing system 200 of FIG. 2 according to some embodiments. In an action box 1110, CLA WAVEFORMS are computed for a plurality of locations adjacent to the target location of a cell of a device under test using a test pattern. At an action box 1120, a location of the cell in the device under test is estimated. For example, an estimated X/Y coordinate could be the center of the cell as measured from a reference point or an origin of the chip. At an action box 1130, the cell is tested at the estimated location using the test pattern to obtain an LP WAVEFORM. At an action box 1140, a degree of fit between each CLA WAVEFORM and the LP WAVEFORM is calculated. At an action box 1150, the laser probe is repositioned closer to the target location based on a CLA WAVEFORM with a highest degree of fit with the LP waveform. Then at action box 1160, defects in the cell are detected based on a comparison of the LP WAVEFORM to the CLA WAVEFORM at the repositioned location. For example, one test pattern that is not expected to cause a failure can be used to determine the probe location, and then another test pattern that exhibits the defect or the original test pattern under conditions that are believed to exhibit the failure can be used to determine the operation of the cell. Note that flow diagram 1100 is similar to flow diagram 500 of FIG. 5 but instead performs an equivalent operation. Instead of testing at each node in an array near a target location of a cell, it tests at one location to determines the one location's position relative to the target location by comparing it to a group of CLA waveforms.

Figure 12:
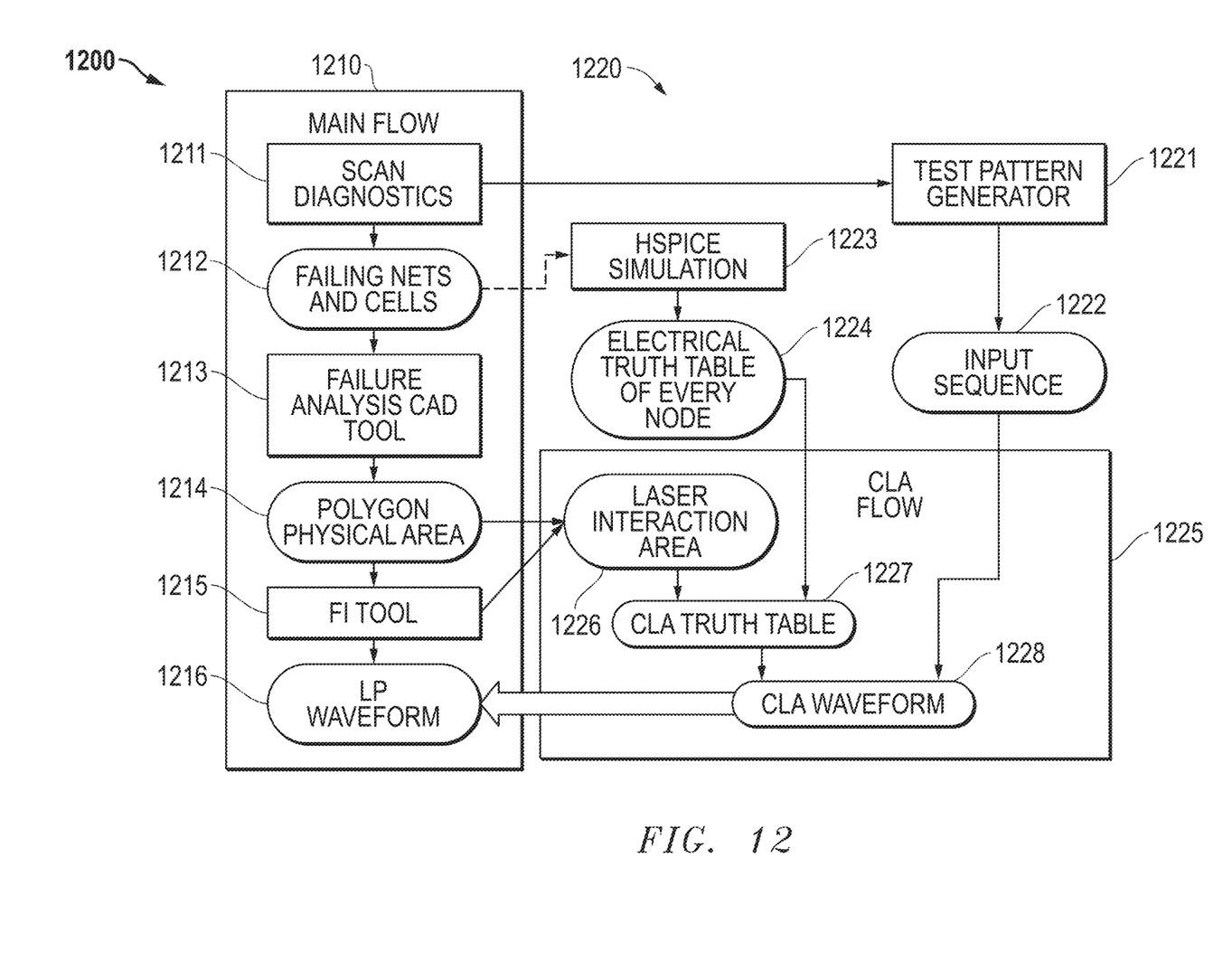
FIG. 12 illustrates in block diagram form a laser voltage probing software ecosystem that can be used to implement the laser probing system of FIG. 2 according to some embodiments.

FIG. 12 illustrates in block diagram form a laser probing (LP) software ecosystem 1200 that can be used to implement the laser probing system of FIG. 2 according to some embodiments. LP software ecosystem 1200 includes an LP main flow 1210 and a CLA flow 1220. LP main flow 1210 includes a scan diagnostics block 1211 that can be used to identify a set of potentially failing circuit networks (nets) and cells 1212. Scan diagnostics block 1211 uses the failing vector information to narrow down the location of the failure, typically to a few nets and/or cells. Next, a failure analysis computer aided design (CAD) tool 1213 is used to define the geometrical shapes of the features corresponding to the failing nets and/or cells. One example of such a tool is the failure analysis tool licensed under the trademarks "Camelot" or "Avalon" by Synopsys, Inc. of Mountain View, Calif. Then an FI tool 1215 is used to generate an LP WAVEFORMs 1216.

CLA flow 1220 includes a test pattern generator 1221 that uses the results from scan diagnostics block 1211 to generate in input sequence 1222, i.e. a test pattern, that generates all possible logic state combinations. An HSPICE simulation block 1223 simulates the electrical performance of the failing cells identified by scan diagnostics block 1211 to generate an electrical truth table 1224 of every node of interest. A CLA simulator 1225 is a mathematical simulator that uses these inputs as well as the polygon physical area 1214 to form the CLA WAVEFORM. One example of a tool that can be used for CLA simulator 1225 is the math simulator program licensed under the trademark "MATLAB" licensed by MathWorks of Natick, Mass. CLA simulator 1225 combines laser interaction area 1226 with electrical truth table 1224 to form a CLA truth table 1227. CLA simulator 1225 uses CLA truth table 1227 and input sequence 1222 to form the CLA WAVEFORM. Test controller 260 updates the position signal to move the optic probe closer to said target location according to a degree of fit between said LP waveform and said CLA waveform.

Figure 13:
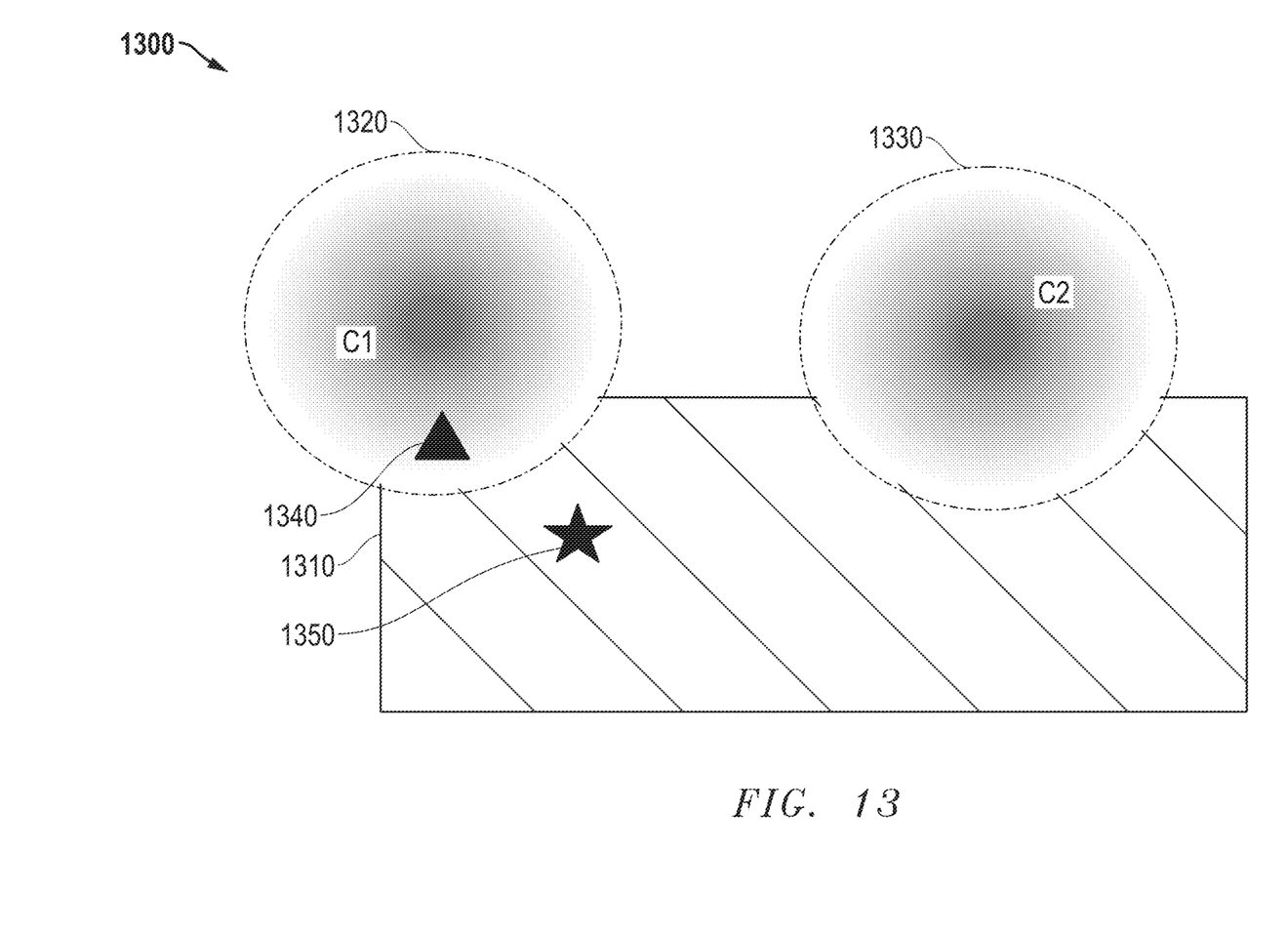
FIG. 13 illustrates a backside view of a portion of an integrated circuit 1300 with cross-talking devices that illustrates a laser probing placement technique for use with the laser probing system of FIG. 2 according to some embodiments.

FIG. 13 illustrates a backside view of a portion of an integrated circuit 1300 with cross-talking devices that illustrates a laser probing placement technique for use with the laser probing system of FIG. 2 according to some embodiments. Integrated circuit 1300 includes a cell of interest 1310 and two cross-talking devices C1 and C2, in which C1 produces significant cross-talk in area 1320 and C2 produces significant cross-talk in area 1330. Cell area 1310 shows two potential probe points 1340 and 1350. If probing occurs at probe point 1340, then cross-talking device C1 affects the measured LP waveform because probe point 1340 is in area 1320. If probing occurs at probe point 1350, however, then cross-talking devices C1 and C2 do not significantly affect the measured LP waveform because probe point 1350 is neither in area 1320 or area 1330.

The existence of cross-talking devices C1 and C2 in the vicinity of cell 1310 that have not been simulated can be performed as follows. When the probe position is within area 1310, for example at probe point 1350, the correlation with the simulated waveform will be strong. When the probe position is in the proximity of a cross-talking device, for example in area 1320, then the correlation will drop significantly. Test controller 260 can perform a correlation near the boundary of cell 1310 to identify the locations and the intensity of the cross-talk, forming a "shmoo" plot within cell 1310 to determine where the results are deterministic, since the cross-talking devices are outside the simulation window. Moreover, test controller 260 can subtract the cross-talk signal from the waveforms collected inside the simulation cell. This technique reduces cross-talk challenges significantly without the need to simulate them.

Alternatively, CLA processor 250 can include cross-talk devices C1 and C2 in the simulation of cell 1310. CLA processor 250 can generate the CLA waveforms taking into account the effects of the cross-talking devices and predict the net signal. Test controller 260 can then determine the probe position using the simulation of the LP signal in the presence of the cross-talking devices.

Some or all of the methods illustrated in FIGS. 5 and 11 and the LP ecosystem illustrated in FIG. 12 may be governed by instructions that are stored in a computer readable storage medium and that are executed by at least one processor. Each of the action boxes shown in FIGS. 5 and 11 and the blocks of the LP ecosystem of FIG. 12 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

While particular embodiments have been described, various modifications to these embodiments will be apparent to those skilled in the art. For example, the degree of fit between the CLA waveform and the LP waveform can be determined by a variety of statistical measures of the degree of fit. Moreover the location of the laser probe can be change by various techniques. One technique, illustrated in FIG. 5 above, derives an expected waveform at a target location and compares the expected waveform to measured waveforms at a set of positions in the vicinity of the cell, and adjusting the location based on the degree of fit. Another technique, illustrated in FIG. 11 above, derives expected waveforms at a set of locations near a target location of a cell, and compares measured waveform to the expected waveforms to determine a relative position to the target location, and then in the vicinity of the cell, and adjusting the location according to distance from the target location. Moreover while the described technique relates specifically to more accurate placement of the laser probe on the die relative to a cell of interest, various techniques that are known in the art may be used to analyze the measured results once the laser probe location has been set.

Accordingly, it is intended by the appended claims to cover all modifications of the disclosed embodiments that fall within the scope of the disclosed embodiments.

What is claimed is:

1. A control system for placement of an optic probe by a laser probing system, comprising:
   a receiver circuit having an input for receiving reflected light produced from the optic probe, a control input for receiving a trigger signal, and an output for providing a laser probe (LP) waveform of said reflected light in response to an activation of said trigger signal; and
   a combinational logic analysis (CLA) processor having an output for providing a CLA waveform in response to simulating an optical response at a target location on a surface of a cell of a device under test to a test pattern; and a test controller having a first input for receiving said CLA waveform, a second input for receiving said LP waveform, a first output for providing said trigger signal, a second output for providing said test pattern, and a third output for providing a position signal, wherein said test controller updates said position signal to move the optic probe closer to said target location according to a degree of fit between said LP waveform and said CLA waveform.

2. The control system of claim 1, wherein said test controller updates the position signal by capturing LP waveforms at each of a plurality of locations near an estimated position of the cell, and updates said position signal corresponding to a position on the device under test closer to said target location according to a highest degree of fit between one of said LP waveforms and said CLA waveform.

3. The control system of claim 1, wherein said CLA processor provides a plurality of CLA waveforms for each of a plurality of locations adjacent to said target location, and said test controller updates said position signal to according to a distance between said target location and one of said locations adjacent to said target location that has a highest degree of fit between said LP waveform and a corresponding one of said CLA waveforms.

4. The control system of claim 1, wherein said CLA processor forms said CLA waveform in response to a laser spread function, a physical area of the cell, simulated voltages of terminals of modulating devices in the cell, and said test pattern.

5. The control system of claim 1, wherein:
said test controller applies said test pattern and activates said trigger signal a plurality of times at a given value of said position signal; and
said receiver circuit capture a plurality of waveforms and forms said LP waveform by summing said plurality of waveforms for said plurality of times.

6. A laser probing system for laser probing a device under test having a cell, comprising:
a laser source;
an optical system adapted to provide an optic probe at selectable locations of the device under test in response to light from said laser source, receives reflected light from the device under test, and outputs said reflected light;
a receiver circuit that receives said reflected light from said optical system, and provides a laser probe (LP) waveform in response to said reflected light; and
a combinational logic analysis (CLA) processor that simulates an optical response at a target location of the cell of the device under test to a test pattern and forms a CLA waveform in response; and
a test controller having a first input for receiving said CLA waveform, a second input for receiving said LP waveform, and an output for providing a position signal, wherein said test controller applies said test pattern to the device under test, triggers said receiver circuit to capture said LP waveform, and repositions said optic probe on the device under test closer to said target location according to a degree of fit between said LP waveform and said CLA waveform.

7. The laser probing system of claim 6, wherein said test controller repositions said optic probe closer to said target location by capturing LP waveforms at each of a plurality of locations near an estimated position of the cell, and repositions said optic probe on the device under test closer to said target location according to a highest degree of fit between one of said LP waveforms and said CLA waveform.

8. The laser probing system of claim 6, wherein said CLA processor provides a plurality of CLA waveforms for each of a plurality of locations adjacent to said target location, and said test controller repositions said optic probe on the device under test closer to said target location according to a distance between said target location and one of said locations adjacent to said target location that has a highest degree of fit between said LP waveform and a corresponding one of said CLA waveforms.

9. The laser probing system of claim 6, wherein said CLA processor forms said CLA waveform in response to a laser spread function, a physical area of the cell, simulated voltages of terminals of modulating devices in the cell, and said test pattern.

10. The laser probing system of claim 6, wherein:
said optic probe has a size on a surface of the device under test of approximately 200 nm; and
the device under test is a semiconductor integrated circuit having transistors whose gate lengths are less than 20 nanometers (nm).

11. The laser probing system of claim 6, wherein said test controller forms said LP waveform by applying said test pattern a plurality of times, and triggers said receiver circuit to capture a plurality of waveforms, and forming said LP waveform by summing said plurality of waveforms.

12. The laser probing system of claim 6, further comprising:
a mirror position controller that controls said optic system to set a focal position of said optic probe on said device under test in response to said position signal.

13. A method of performing an optic probe test, comprising:
computing a combinational logic analysis (CLA) waveform at a target probe location within a cell of a device under test using a test pattern;
positioning an optic probe at an initial location in response to an estimated location of the cell;
applying said test pattern to the cell and obtaining a first laser probe (LP) waveform in response;
positioning said optic probe at an adjacent location;
applying said test pattern to the cell and obtaining a second LP waveform in response; and
repositioning said optic probe at a location closer to said target probe location according to a degree of fit of a corresponding LP waveform and said CLA waveform; and
identifying defects based on a comparison of an actual waveform to said CLA waveform at said location closer to said target probe location.

14. The method of claim 13, wherein obtaining said actual waveform comprises:
applying said test pattern to the cell at said initial location and obtaining the first LP waveform in response;
calculating a first degree of fit of said first LP waveform with respect to said CLA waveform at said initial location;
performing said test at said adjacent location and obtaining a second measured waveform in response; and
calculating a second degree of fit of said second measured waveform with respect to said CLA waveform at said adjacent location,
wherein said repositioning comprises repositioning said optic probe to said adjacent location if said second degree of fit is greater than said first degree of fit.

15. The method of claim 14, wherein performing said test at said initial location comprises:
applying said test pattern to the device under test; and triggering a capture of said first LP waveform in response to said applying.

16. The method of claim 13, wherein said repositioning comprises:
   performing tests at said initial location and obtaining a first measured waveform in response;
   calculating a first degree of fit of said first measured waveform with respect to said CLA waveform at said initial location;
   performing tests at a plurality of adjacent locations and obtaining a plurality of second measured waveforms in response;
   calculating a plurality of second degrees of fit of corresponding ones of said second measured waveforms with respect to said CLA waveform at said plurality of adjacent locations; and
   repositioning said optic probe at one of said plurality of adjacent locations with a highest degree of fit.

17. The method of claim 16, wherein performing said tests at said plurality of adjacent locations comprises:
   performing said tests at a first plurality of locations in a first direction;
   determining a highest degree of fit between said LP waveform of each of said first plurality of locations in said first direction and said CLA waveform; and
   performing tests at a second plurality of locations in a second direction orthogonal to said first direction;
   determining a highest degree of fit between said LP waveform of each of said second plurality of locations in said first direction and said CLA waveform; and
   repositioning said optic probe at said highest degree of fit in said first direction and said highest degree of fit in said second direction.

18. The method of claim 17, further comprising:
   measuring cross-talk produced by an interfering circuit at the plurality of locations; and
   subtracting the cross-talk, so measured, from said location closer to said target probe location.

19. The method of claim 17, further comprising:
   measuring cross-talk produced by an interfering circuit at the plurality of locations; and
   repositioning said optic probe based on the cross-talk, so measured.

20. The method of claim 13, wherein said computing said CLA waveform comprises:
   simulating cross-talk from and interfering circuit; and
   computing said CLA waveform in response to said simulating.

* * * * *